(12) United States Patent
Lee et al.

(10) Patent No.: US 6,744,064 B2
(45) Date of Patent: Jun. 1, 2004

(54) NITRIDE SEMICONDUCTOR LIGHT EMITTING DEVICE

(75) Inventors: Sung-nam Lee, Kyungki-do (KR); Yong-jo Park, Kyungki-do (KR); Ok-hyun Nam, Seoul (KR); In-hwan Lee, Kyungki-do (KR); Won-seok Lee, Seoul (KR); Shi-yun Cho, Seoul (KR); Cheol-soo Sone, Kyungki-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 168 days.

(21) Appl. No.: 09/776,846

(22) Filed: Feb. 6, 2001

(65) Prior Publication Data

US 2001/0030317 A1 Oct. 18, 2001

(30) Foreign Application Priority Data

Feb. 8, 2000 (KR) .............................................. 00-5736
Jan. 11, 2001 (KR) .............................................. 01-1550

(51) Int. Cl.$^7$ .............................................. H01L 29/06
(52) U.S. Cl. .............................. 257/13; 257/15; 257/22; 257/96; 257/103
(58) Field of Search ............................. 257/13, 15, 22, 257/94, 96, 101, 103; 372/45, 46

(56) References Cited

FOREIGN PATENT DOCUMENTS

WO          WO 99/46822        *  9/1999

* cited by examiner

Primary Examiner—Sara Crane
(74) Attorney, Agent, or Firm—Burns, Doane, Swecker & Mathis, L.L.P.

(57) ABSTRACT

A semiconductor light emitting device including means for reducing strain and carrier overflow caused by injection of a number of carriers in semiconductor light emitting devices using GaN is provided. The semiconductor light emitting device includes a multi-quantum barrier formed by depositing an AlGaN/GaN double layer a predetermined number of times, or a strain-compensating multiple quantum barrier formed at either the upper or lower sides of an active layer by depositing an AlGaN/InGaN double layer a predetermined number of times, and does not need a p-type clad layer.

16 Claims, 10 Drawing Sheets

NITRIDE SEMICONDUCTOR LIGHT EMITTING DEVICE

BACKGROUND OF THE INVENTION

1. Field of the Invention

The present invention relates to a semiconductor light emitting device, and more particularly, to a laser diode capable of reducing strain by preventing overflow of carriers caused by injection of a number of carriers in a semiconductor light emitting device using GaN.

2. Description of the Related Art

Referring to FIG. 1, a semiconductor light emitting device comprising a conventional semiconductor laser diode or a light amplifier, consists of active layers, $In_yGa_{1-y}N/In_yGa_{1-y}N$ layers 1 and 2, a p-$Al_xGa_{1-x}N$ carrier blocking layer 3 and a p, n-GaN light waveguide layer, having a multi-quantum well (hereinafter, referred to as a MQW) structure.

FIG. 2 is an energy band diagram of the structure of the semiconductor light emitting device of FIG. 1. In this figure, carriers having the MQW structure are formed so as not to pass through an energy barrier of a carrier blocking layer.

A semiconductor light emitting device such as a bluish green laser diode or a light amplifier must be equipped with such an energy band structure. The bluish green laser diode is an important element required for recording on and reproducing data from a high-density recording medium such as a DVD.

In order to realize a bluish green laser device which usually operates at a low laser-emission starting current and has a good temperature property, the bluish green laser device should be designed to have a structure which enables efficient current injection into an active layer and the reduction of the number of carriers passing through the active layer. In general, to prevent carriers from overflowing, a method for inserting an electron blocking layer 3, illustrated in FIG. 1, which can block electrons, that is, carriers, has been used.

In the case of a GaN bluish green laser basically made of a GaN compound semiconductor, there is no substrate whose lattice constant is consistent with that of GaN, and thus, the quality of crystals such as GaN, InGaN, and AlGaN grown by using a MOCVD method, is not good. Accordingly, light gain of InGaN used as an active layer is reduced. Therefore, a very large amount of injection current, that is, a large number of carriers is needed for generating a laser beam. Moreover, as the amount of injected current increases, the number of carriers overflowing into not only the active layer but also a GaN layer or an AlGaN layer used as a barrier also increases, and thus, it is impossible to efficiently generate a laser beam. To solve this problem, as illustrated in FIG. 1, insertion of a carrier blocking layer consisting of an AlGaN mono layer having a thickness of 200 Å has been widely applied by various research groups. However, the insertion of an AlGaN mono layer can hardly prevent overflow of carriers having an energy higher than a barrier. To block high energy carriers, a layer formed of a compound containing Ga, N and a large amount of Al may be used. However, the AlGaN layer causes additional strain with respect to a GaN layer whose lattice constant is not consistent with that of the AlGaN layer, whereby cracks in samples usually occur. Also, in order to efficiently block carriers, a p-type impurity doping process may be performed. However, it is well known that a process for doping the layer formed of a compound containing Ga, N and a large amount of Al with a p-type impurity is very difficult.

SUMMARY OF THE INVENTION

To solve the above problems, it is an object of the present invention to provide a nitride semiconductor light emitting device capable of efficiently preventing current injected into an active layer from overflowing a barrier and minimizing strain.

It is another object of the present invention to provide a nitride semiconductor light emitting device capable of efficiently preventing current injected into an active layer from overflowing a barrier, minimizing strain, reducing the amount of optical loss in the direction of installation of a substrate, preventing deterioration of an active layer and simplifying a process for manufacturing the nitride semiconductor light emitting device.

Accordingly, to achieve the first object of the present invention, there is provided a nitride semiconductor light emitting device including an active layer formed of a GaN family compound semiconductor and multi-quantum barrier layers formed by repeatedly depositing a double layer consisting of an $Al_xGa_{1-x}N$ layer (0<x<1) and a GaN layer at least two times, at either the upper or lower side of the active layer, by which an energy band has a multi-quantum barrier structure. The nitride semiconductor light emitting device further includes GaN light waveguide layers formed at the upper and lower sides of the active layer or at the upper and lower sides of the multi-quantum barrier layers. The active layer is formed by depositing a double layer consisting of an $In_xGa_{1-x}N$ layer and an $Al_yGa_{1-y}N$ layer, a double layer consisting of an $In_xGa_{1-x}N$ layer and an $In_yAl_zGa_{1-y-z}N$ layer, a double layer consisting of an $In_xAs_yGa_{1-x-y}N$ layer and $In_zGa_{1-z}N$ layer or a double layer consisting of an $In_xAs_yGa_{1-x-y}N$ layer and an $Al_yGa_{1-y}N$ layer a predetermined number of times to form a multi-quantum well structure and at this time, $0 \leq x \leq 1$, $0 \leq y < 1$, $0 \leq z < 1$, $x+y<1$ and $y+z<1$.

Preferably, the multi-quantum barrier layer is formed of double layers of the $Al_xGa_{1-x}N$ layer and the GaN layer by making the thickness of the $Al_xGa_{1-x}N$ layer of each double layer differ from the thicknesses of the $Al_xGa_{1-x}N$ layers of the other double layers or making the thickness of the GaN layer of each double layer differ from the thicknesses of the GaN layers of the other double layers, thereby making the energy levels of multi-quantum barrier layers differ from each other. Or, it is preferable that the multi-quantum barrier layer consisting of the $Al_xGa_{1-x}N$ layer and the GaN layer, is formed by making the value of x for of aluminum of the $Al_xGa_{1-x}N$ layer of each double layer differ from the value of x for the $Al_xGa_{1-x}N$ layers of the other double layers, thereby making the energy levels of multi-quantum barrier layers differ from each other.

Preferably, the multi-quantum barrier layer is formed by repeatedly depositing a double layer consisting of an $Al_xGa_{1-x}N$ layer and an $In_yGa_{1-y}N$ layer (0<x<1, 0<y≦1), so that its energy band can have a multi-quantum barrier structure. In this case, the multi-quantum barrier layer is formed by making the thickness of the $Al_xGa_{1-x}N$ layer of each double layer differ from the thicknesses of the $Al_xGa_{1-x}N$ layers of the other double layers of making the thickness of the $In_yGa_{1-y}N$ layer of each double layer differ from the thicknesses of the $In_yGa_{1-y}N$ layers of the other double layers, thereby making the energy levels of multi-quantum barrier layers differ from each other. Or, the multi-quantum barrier layer is formed by making the value of x for the $Al_xGa_{1-x}N$ layer of each double layer differ from the value of x of aluminum of the $Al_xGa_{1-x}N$ layers of the other double layers, thereby making the energy levels of multi-quantum barrier layers differ from each other._

To achieve the second object of the present invention, there is provided a nitride semiconductor light emitting device in which, among p-type material layers formed at one side of an active layer and n-type material layers formed at the other side of the active layer, a p-type clad layer is removed, an n-type clad layer is formed to have an energy band thicker than the counterpart of the prior art, and the carrier-blocking efficiency of a carrier barrier layer formed between the p-type material layers and the active layer is enhanced.

Also, to achieve the second object of the present invention, there is provided a nitride semiconductor light emitting device including a substrate, an active layer formed on the substrate, in which light emission occurs, an n-type material layer for generating a laser beam which is formed between the substrate and the active layer and includes an n-type clad layer for preventing light loss in the direction of installation of the substrate, a carrier blocking layer, a p-type waveguide layer and a p-type compound semiconductor layer which are sequentially deposited on the active layer and an n-type electrode and a p-type electrode generating a potential difference for diffusion of electrons to the active layer. Here, the n-type material layer comprises an n-type waveguide layer formed between the n-type clad layer and the active layer and an n-type compound semiconductor layer formed between the n-type clad layer and the substrate and connected to the n-type electrode. The active layer is a III-V group nitride compound semiconductor layer having a multi-quantum well structure.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention now will be described more fully with reference to the accompanying drawings, in which preferred embodiments of the invention are shown.

Figure 1:
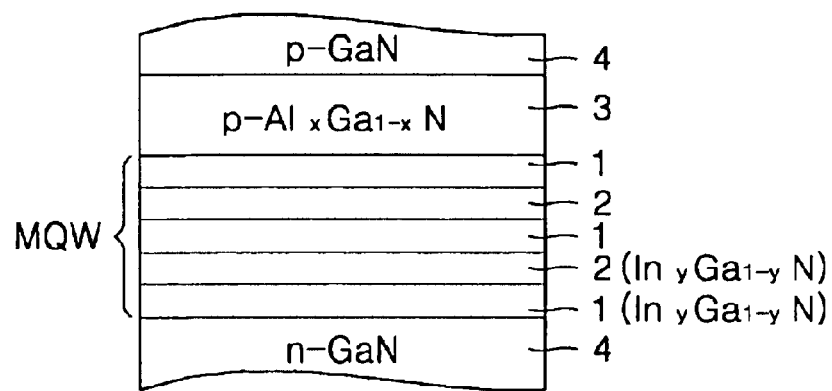
FIG. 1 is a schematic vertical cross-sectional view of a semiconductor light emitting device having a conventional quantum barrier.
Figure 2:
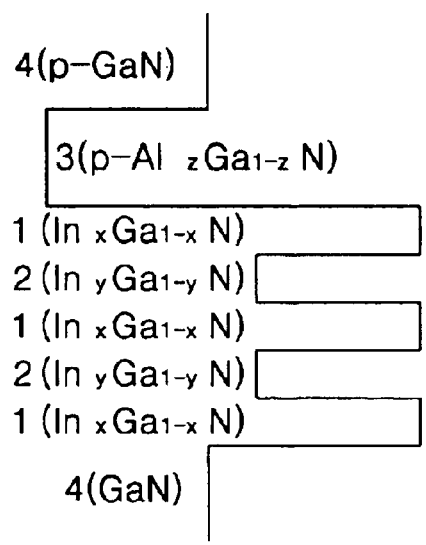
FIG. 2 is an energy band diagram illustrating an electron blocking barrier of the semiconductor light emitting device having a quantum barrier, illustrated in FIG. 1.
Figure 3:
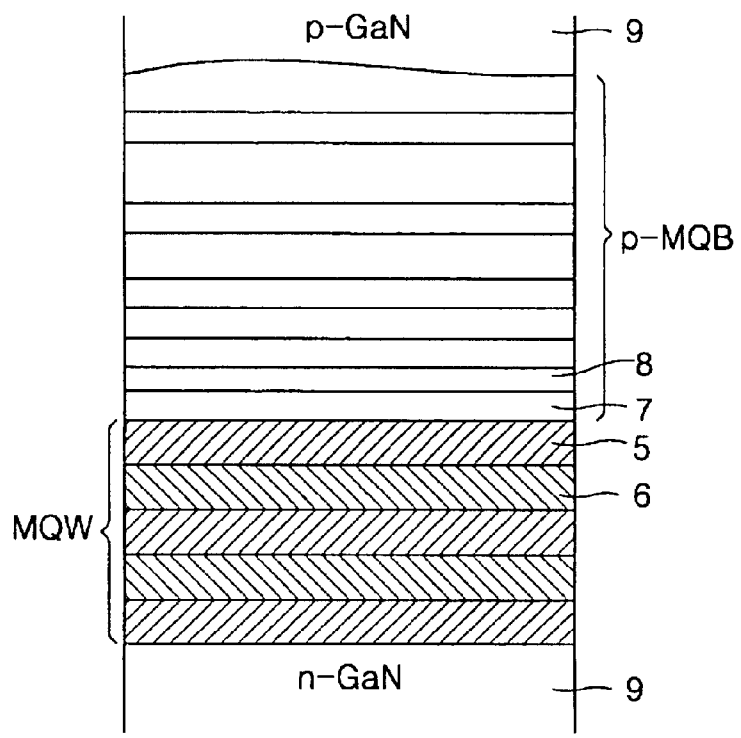
FIG. 3 is a cross-sectional view of a semiconductor light emitting device including an $Al_xGa_{1-x}N/GaN$ multiple-quantum barrier or an $Al_xGa_{1-x}N/In_yGa_{1-y}N$ strain compensating multiple quantum barrier as means for reducing carrier overflow and strain, according to a first embodiment of the present invention.
Figure 4:
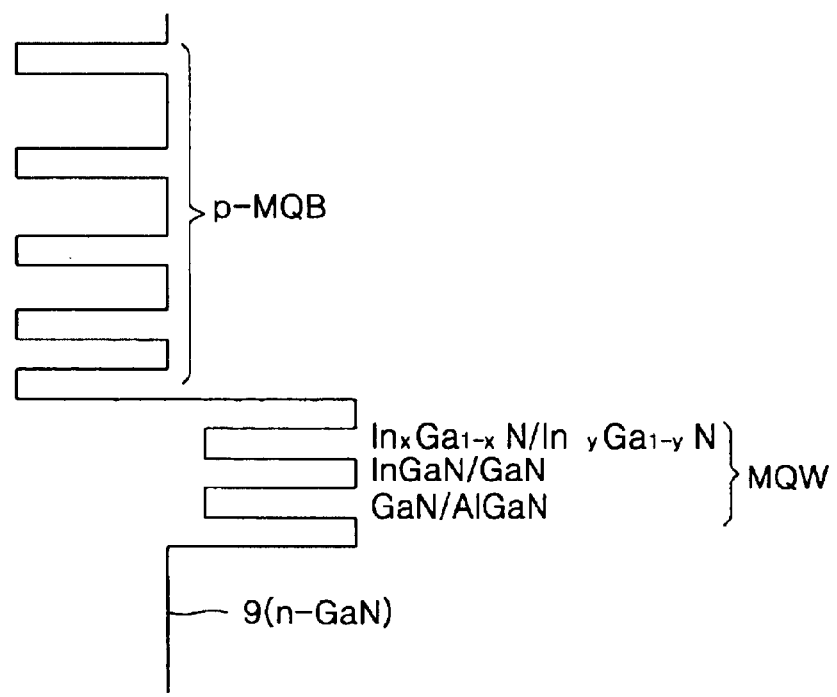
FIG. 4 is an energy band diagram of the semiconductor light emitting device illustrated in FIG. 3.
Figure 5:
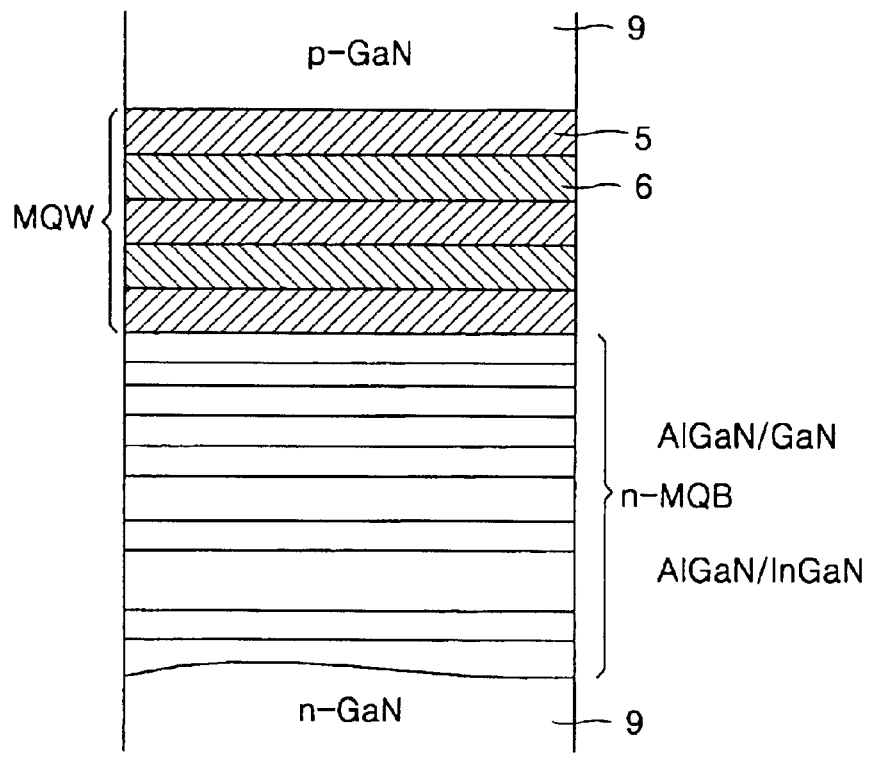
FIG. 5 is a cross-sectional view of a semiconductor light emitting device including an $Al_xGa_{1-x}N/GaN$ multiple-quantum barrier or an $Al_xGa_{1-x}N/In_yGa_{1-y}N$ strain compensating multiple quantum barrier as means for reducing carrier overflow and strain, according to a second embodiment of the present invention.
Figure 6:
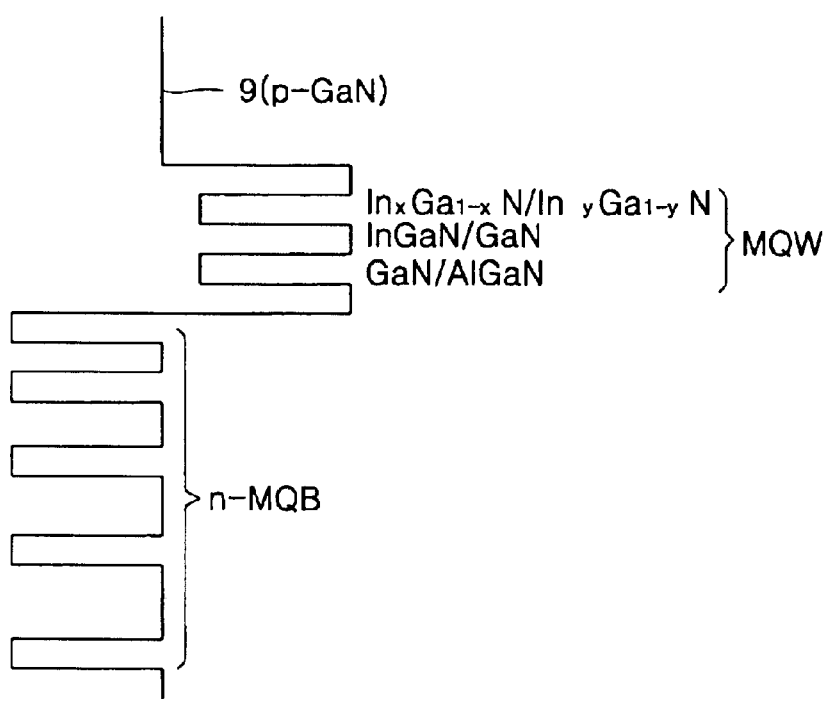
FIG. 6 is an energy band diagram of the semiconductor light emitting device illustrated in FIG. 5.
Figure 7:
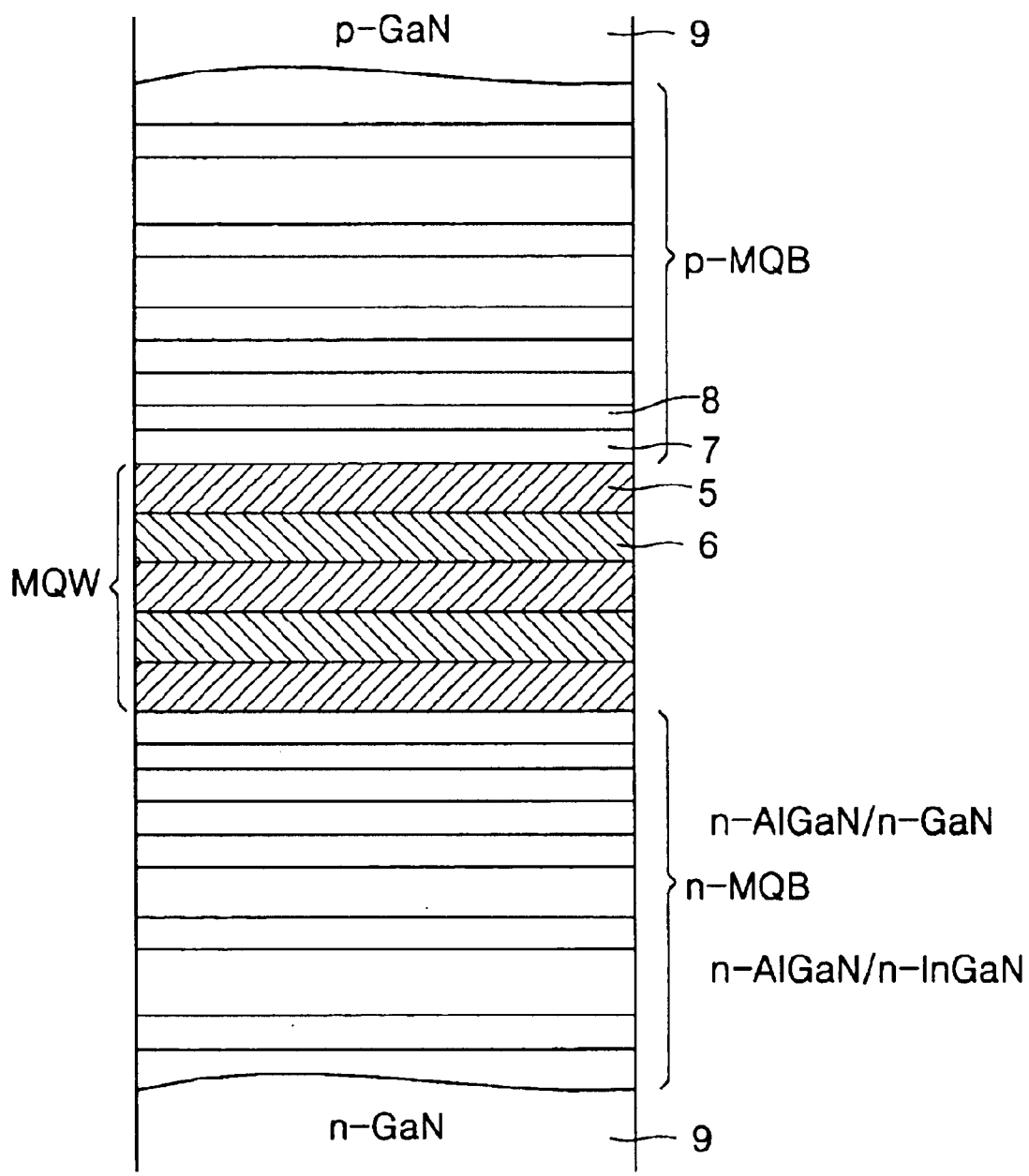
FIG. 7 is a vertical cross-sectional view of a semiconductor light emitting device including an $Al_xGa_{1-x}N/GaN$ multiple-quantum barrier or an $Al_xGa_{1-x}N/In_yGa_{1-y}N$ strain compensating multiple quantum barrier as means for reducing carrier overflow and strain, according to a third embodiment of the present invention.
Figure 8:
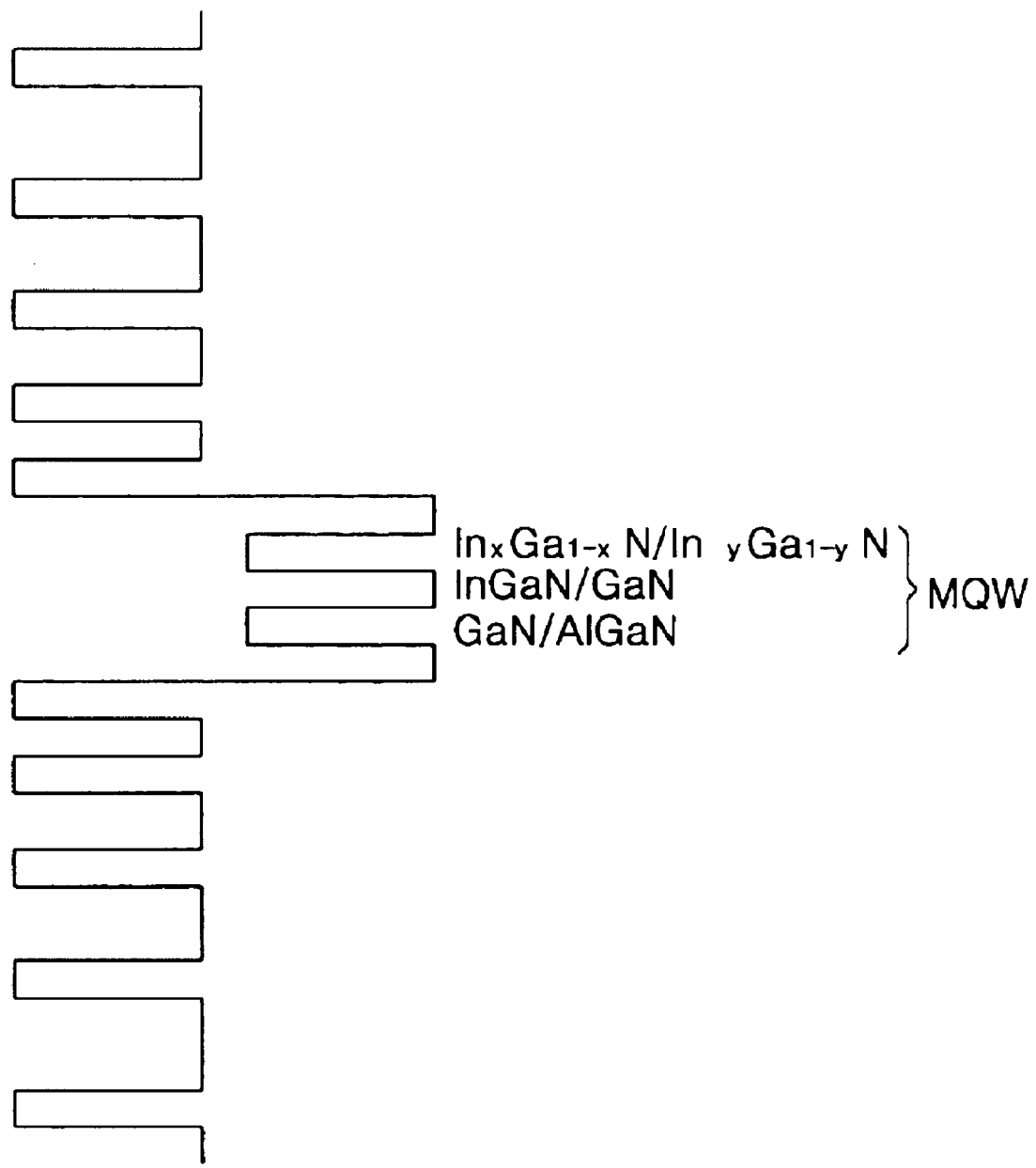
FIG. 8 is an energy band diagram of the semiconductor light emitting device illustrated in FIG. 7.

As illustrated in FIGS. 3 through 8, in a structure for preventing carrier overflow, which occurs due to injection of many carriers into an active layer formed in a multi-quantum well structure in a semiconductor light emitting device using GaN, a multiple-quantum barrier (MQB) is formed at either the upper or lower side of the active layer. In other words, as illustrated in FIG. 3, the MQBs 7 and 8 can be formed at the upper side of the active layers 5 and 6, or as illustrated in FIG. 5, the MQBs 7 and 8 can be formed at the lower side of the active layers 5 and 6. In addition, it is also possible to form the MQBs 7 and 8 at both the upper and lower sides of the active layers 5 and 6. FIGS. 4, 6 and 8 are energy band diagrams of embodiments of FIGS. 3, 5, and 7, respectively.
First and Second Embodiments Referring to FIGS. 3 and 5, a semiconductor light emitting device having a multi-quantum barrier according to the present invention includes active layers formed by depositing a mono active layer (not shown) formed of a GaN-family compound semiconductor, a double layer consisting of an $In_xGa_{1-x}N$ layer and an $Al_yGa_{1-y}N$ layer, a double layer consisting of an $In_xGa_{1-x}N$ layer and an $In_yAl_zGa_{1-y-z}N$ layer, a double layer consisting of an $In_xAs_yGa_{1-x-y}N$ layer and $In_zGa_{1-z}N$ layer or a double layer consisting of an $In_xAs_yGa_{1-x-y}N$ layer and an $Al_yGa_{1-y}N$ layer a predetermined number of times. Here, $0 \leq x \leq 1$, $0 \leq y \leq 1$, $0 \leq z < 1$, $x+y<1$ and $y+z<1$. Then, a blocking layer for preventing overflow of carriers having an energy higher than a barrier, injected into the active layers 5 and 6, is inserted. In order to maximize the blocking effect of the blocking layer and minimize the influence of strain caused by the blocking layer, strain-compensating MQB layers 7 and 8 in which an energy band has a multi-quantum barrier structure, are formed at the upper side of the active layers 5 and 6 (this case refers to the first embodiment) or at the lower side of the active layers 5 and 6 (this case refers to the second embodiment) by depositing a double layer of an $Al_xGa_{1-x}N$ layer and a GaN layer, a double layer of an $Al_xGa_{1-x}N$ layer and an $In_yGa_{1-y}N$ layer (0<x<1 and 0<y≦1), or a double layer of an $Al_xGa_{1-x}N$ layer and an $Al_yGa_{1-y}N$ layer (0<x<1, 0≦y<1, and x>y) at least two times.

Third Embodiment

As shown in FIG. 7, in case each of the strain compensating MQB layers 7 and 8 is formed of a plurality of double layers, each consisting of an $Al_xGa_{1-x}N$ layer and a GaN layer, in order to make MQB layers differ in energy level from each other, the $Al_xGa_{1-x}N$ layers or the GaN layers in every double layer are made to have a different thickness from each other. Or, in order to make the layers constituting the MQB layers differ in energy level from one another the $Al_xGa_{1-x}N$ layers 7 are made to have different values of x from each other.

Also, in case each of the strain compensating MQB layers 7 and 8 is formed by repeatedly depositing a double layer consisting of an $Al_xGa_{1-x}N$ layer and an $In_yGa_{1-y}N$ layer at least two times, in order to make the MQB layers differ in energy level from each other, the $Al_xGa_{1-x}N$ layer or the $In_yGa_{1-y}N$ layer of each of the double layers is made to have a different thickness than the $Al_xGa_{1-x}N$ layers or the $In_yGa_{1-y}N$ layers of the other double layers. Or, in order to make the layers constituting the MQB layers differ in energy level from one another, the value of x for the $Al_xGa_{1-x}N$ layer 7 in each double layer is made to be different from the value of x for aluminum of the $Al_xGa_{1-x}N$ layers 7 in the other double layers.

Also, in case each of the strain compensating MQB layers 7 and 8 is formed by repeatedly depositing a double layer consisting of an $Al_xGa_{1-x}N$ layer and an $Al_yGa_{1-y}N$ layer at least two times, in order to make the MQB layers differ in energy level from each other, the $Al_xGa_{1-x}N$ layer or the $Al_yGa_{1-y}N$ layer of each of the double layers is made to have a different thickness than the $Al_xGa_{1-x}N$ layers or the $Al_yGa_{1-y}N$ layers of the other double layers. Or, in order to make the layers constituting the MQB layers differ in energy level from one another, the value of x for the $Al_xGa_{1-x}N$ layer 7 in each double layer is made to be different from the value of x for aluminum of the $Al_xGa_{1-x}N$ layers 7 in the other double layers.

The strain compensating multi-quantum barrier double layers 7 and 8 are capable of blocking carriers injected into each of the active layers 5 and 6 having a multi-quantum well structure. In other words, a multi-quantum barrier double layer can reduce overflow of carriers more greatly than a mono-layer carrier blocking barrier because of a quantum effect in that carriers are kept in a quantum well within a multi-quantum barrier due to their wavelike property.

Figure 9:
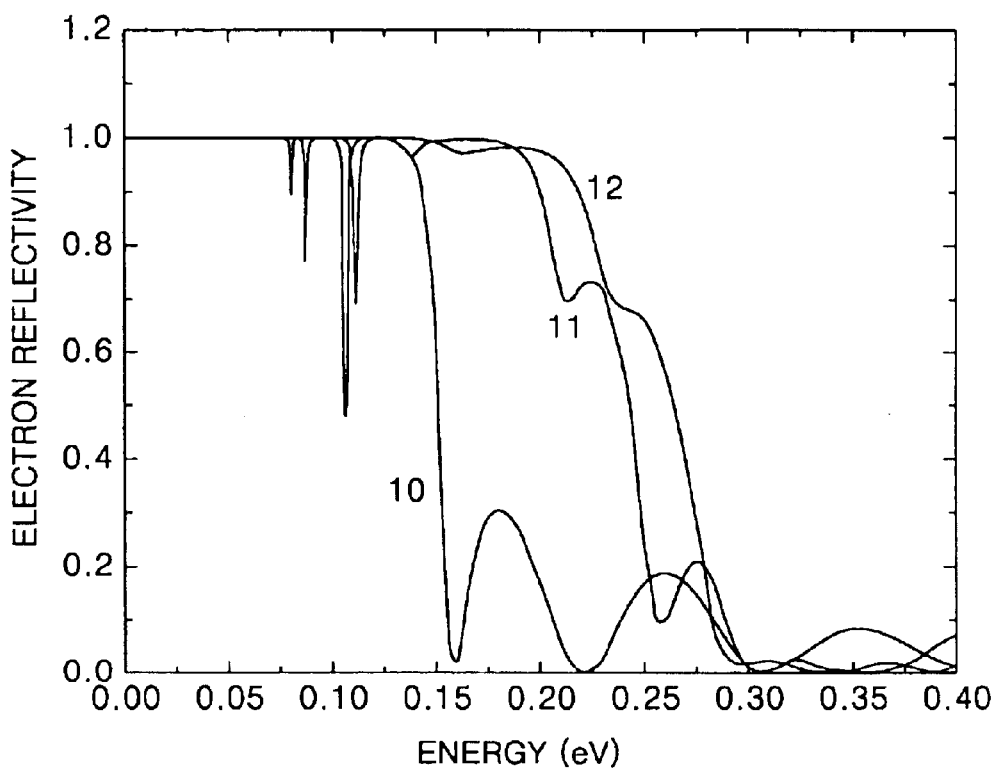
FIG. 9 is a graph illustrating the electron reflectivity of the $Al_xGa_{1-x}N/In_yGa_{1-y}N$ strain compensating multiple quantum barrier included in the semiconductor light emitting device illustrated in FIG. 3.

FIG. 9 is a graph illustrating the result of calculating carrier reflectivity in the cases of using the conventional AlGaN mono-layer carrier blocking barrier 10 and using the $Al_xGa_{1-x}N/In_yGa_{1-y}N$ strain compensating multi-quantum barrier 12. Referring to FIG. 9, due to the quantum effect of a multi-quantum barrier, energy barriers caused by difference in energy level become very high from the standpoint of injected carriers. In the case of the $Al_xGa_{1-x}N/In_yGa_{1-y}N$ strain compensating multi-quantum barrier 12, the reflection ratio of high energy carriers is high. Therefore, the $Al_xGa_{1-x}N/In_yGa_{1-y}N$ strain compensating multi-quantum barrier 12 can be used as a more efficient energy barrier. In addition, in the case of $Al_xGa_{1-x}N/In_yGa_{1-y}N$ strain compensating multi-quantum barrier 12, AlGaN has tensile strain with respect to GaN, whereas InGaN has compressive strain with respect to GaN, thereby enabling strain compensating. As a result, it is possible to grow a thick quantum barrier having no cracks.

As described above, the semiconductor light emitting device according to the present invention has a multi-quantum barrier structure in which an AlGaN/GaN double layer or an AlGaN/InGaN double layer is repeatedly grown on an active layer region in order to prevent carriers from overflowing from an active layer to an inactive layer. The effect of the multi-quantum barrier of preventing carriers injected into an active layer from overflowing can be ascertained by comparing the laser-emitting characteristics of a structure in which an $Al_xGa_{1-x}N$/GaN multi-quantum barrier proposed in the present invention is employed with those of a structure in which a conventional electron blocking layer is inserted.

Figure 10:
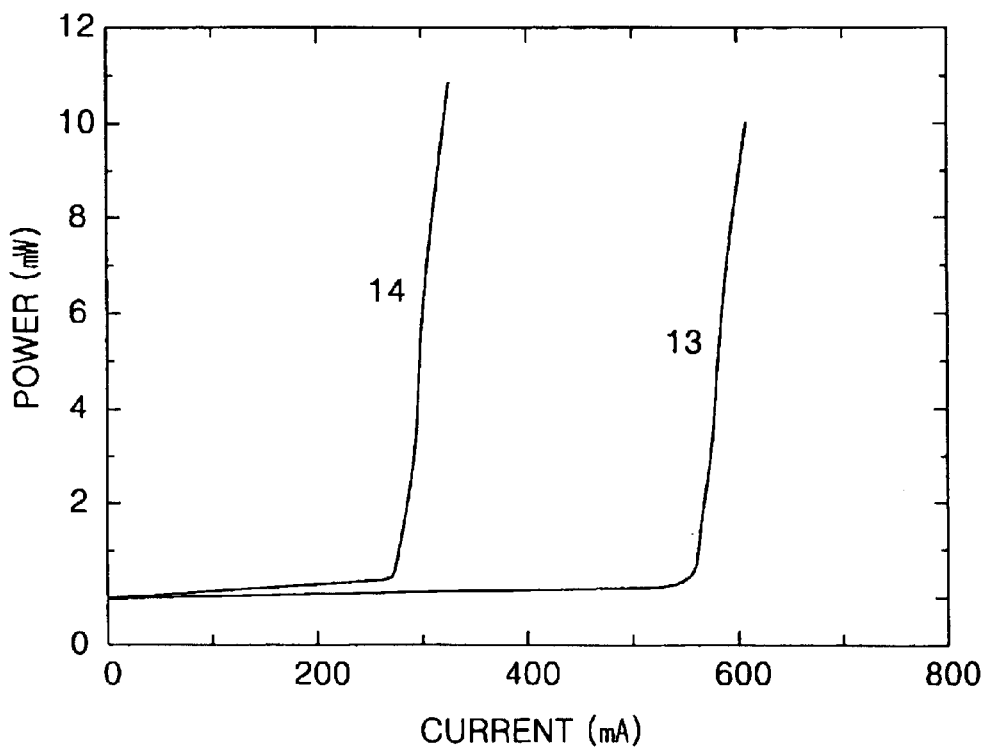
FIG. 10 is a graph illustrating the P-I characteristics of a semiconductor light emitting device having a conventional quantum barrier and a semiconductor light emitting device including an $Al_xGa_{1-x}N/In_yGa_{1-y}N$ strain compensating multiple quantum barrier as means for reducing carrier overflow and strain, according to embodiments of the present invention.

FIG. 10 shows the P-I characteristics of the above two structures. In this graph, the laser-emission starting current of the conventional structure 13 is about 550 mA and the emitting starting current of the structure 14 according to the present invention is about half the emitting starting current of the conventional structure, that is, about 270 mA. The two structures have the same active layer structure so it is reasonable to suppose their light gain values caused by carriers are the same. Accordingly, the decrease of emitting starting current in the structure according to the present invention means the increase of light gain, because in the case of the structure according to the present invention, the number of carriers existing in an active layer increases due to efficient overflow of carriers, even in the case of applying the same current to the two structures.

Fourth Embodiment

This embodiment deals with a laser diode including an efficient electron blocking barrier layer instead of a multi-quantum barrier layer, and a n-type clad layer, where a p-type clad layer has been removed.

Figure 11:
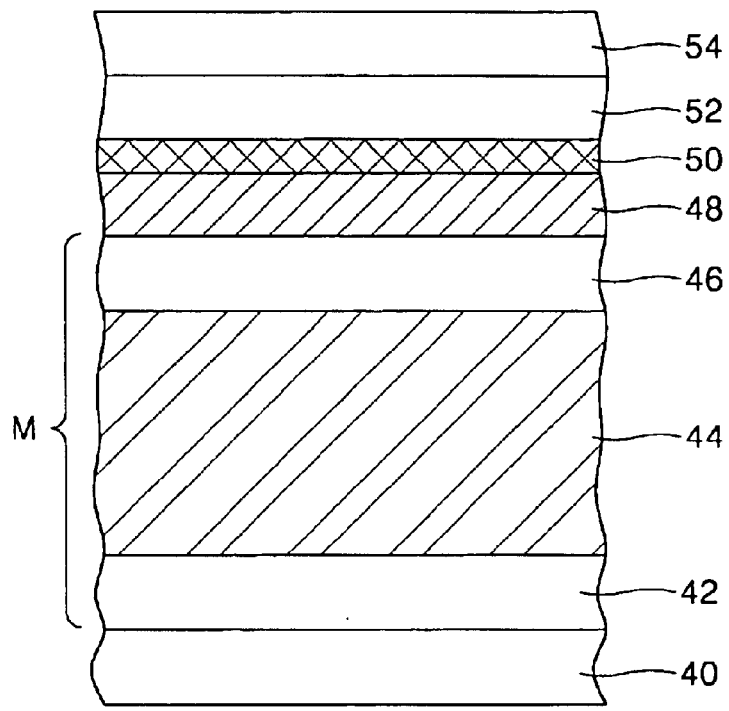
FIG. 11 is a cross-sectional view of a semiconductor light emitting device according to a fourth embodiment of the present invention.

In FIG. 11, reference numeral 40 indicates a substrate. The substrate 40 is preferably a sapphire substrate, however it can be formed of one selected from a group including silicon carbon SiC, silicon Si, gallium arsenic GaAs, gallium nitride GaN and zinc oxide ZnO. According to the material of the substrate 40, an electrode can be placed at the bottom surface of the substrate 40 or the upper side of the substrate 40. For example, in case the substrate 40 is a sapphire substrate, an electrode can be placed at the upper side of the substrate 40 so as to be in contact with another material layer which is necessary because the substrate has a high resistance. In case the substrate 40 is made of silicon carbon, the electrode can be placed so as to be in contact with the bottom surface of the substrate 40. Also, in case a p-type electrode is formed in a ridge shape, an n-type electrode can be placed so as to be in contact with an n-type compound semiconductor layer. There are various methods for forming an electrode in addition to the methods described above.

Next, an n-type material layer M for generating a laser beam is formed on the substrate. The n-type material layer M consists of an n-type compound semiconductor layer 42, an n-type clad layer 44 and an n-type waveguide layer 46 which are sequentially deposited on the substrate 40. The n-type compound semiconductor layer 42 is made of one of III-V group nitride compounds and it is preferably an n-GaN layer. Preferably, the n-type clad layer 44 is an n-$Al_xGa_{1-x}N$ mono-layer (where 0<x ≦0.2) containing a predetermined percentage of aluminum Al; however, it may be a double layer, such as a supperlattice layer consisting of an AlGaN layer and a GaN layer. Also preferably the n-type clad layer 44 has a thickness to minimize the loss of light mode in the direction of installation of the substrate 40. For example, the n-type clad layer 44 has a thickness between 0.5 μm and 1.7 μm. At this time, the strain of the entire semiconductor light emitting device must be considered. Thus, it is preferable that the n-type clad layer 44 is thinner than the minimum value of the above thickness range in order to reduce the strain of the entire semiconductor light emitting device. If the n-type clad layer 44 is thickly formed, the loss of light mode to the substrate 40 can be minimized. The n-type waveguide layer 46 is preferably an n-GaN layer which is one of III-V group nitride compound semiconductor layers. An active layer 48 is formed on the n-type material layer M for generating a laser beam and the active layer 48 is preferably a material layer having a multi-quantum well structure. Also preferably, the active layer 48 is III-V group nitride compound semiconductor layer and more preferably it is an InGaN layer containing a predetermined percentage of indium (In). Also, the active layer 48 may be a monolayer or a double layer described in the first, second and third embodiments and its description will not be repeated here. An electron blocking layer 50 and a p-type waveguide layer 52 are sequentially formed on the active layer 48. At this time, the electron blocking layer 50 is preferably an AlGaN layer containing a predetermined percentage of aluminum in order to enhance the electron blocking efficiency; however it may be a multi-quantum barrier layer 5 and 6 described in the first through third embodiments. The p-type waveguide layer 52 has almost the same structure as the n-type waveguide layer 46 except that a p-type doping material is used. Preferably, the p-type waveguide layer 52 has a thickness to get the highest value in light mode and light gain, such as 0.15 μm~0.2 μm. A p-type compound semiconductor layer 54 is formed on the p-type wave layer 52. Preferably, the p-type compound semiconductor layer 54 has almost the same structure as the n-type compound semiconductor layer 42 except that an n-type doping material is used. However, on the p-type compound semiconductor layer 54, a p-type electrode (not shown) is formed, and thus, it is preferable that the p-type compound semiconductor layer 54 has a higher doping concentration than the p-type waveguide layer 52 in order to make its electrical resistance low. For example, the p-type waveguide layer 52 and the p-type compound semiconductor layer 54 can be the same material layer, wherein the doping concentration of the p-type compound semiconductor layer 54 is higher than that of the p-type waveguide layer 52.

As described above, the laser diode according to the fourth embodiment of the present invention includes an n-type clad layer enhancing the blocking efficiency of a carrier barrier layer, that is, an electron blocking layer, and having a greater thickness than a conventional n-type clad layer, instead of a p-type clad layer.

A process for forming a p-type clad layer (p-AlGaN) is performed at a higher temperature than processes for other material layers and it is accompanied by a doping process. In case the p-type clad layer is not formed, the high-temperature process and the doping process can be omitted, thereby simplifying the whole manufacturing process and preventing the characteristics of the active layer 48 from changing. Also, since the p-type clad layer is thermally and crystallographically mismatched with the active layer 48, if the p-type clad layer is not formed, the strain on the laser diode decreases and cracks on a semiconductor light emitting device can be prevented. In addition, the resistance and operational voltage of the semiconductor light emitting device can be lowered, thereby enhancing the reliability of the device. Also, an n-type clad layer can be formed as thick as the strain margin resulting from not installing of the p-type clad layer, thereby reducing the loss of light mode in the direction of installation of a substrate and obtaining stable light mode and improved light gain.

Figure 12:
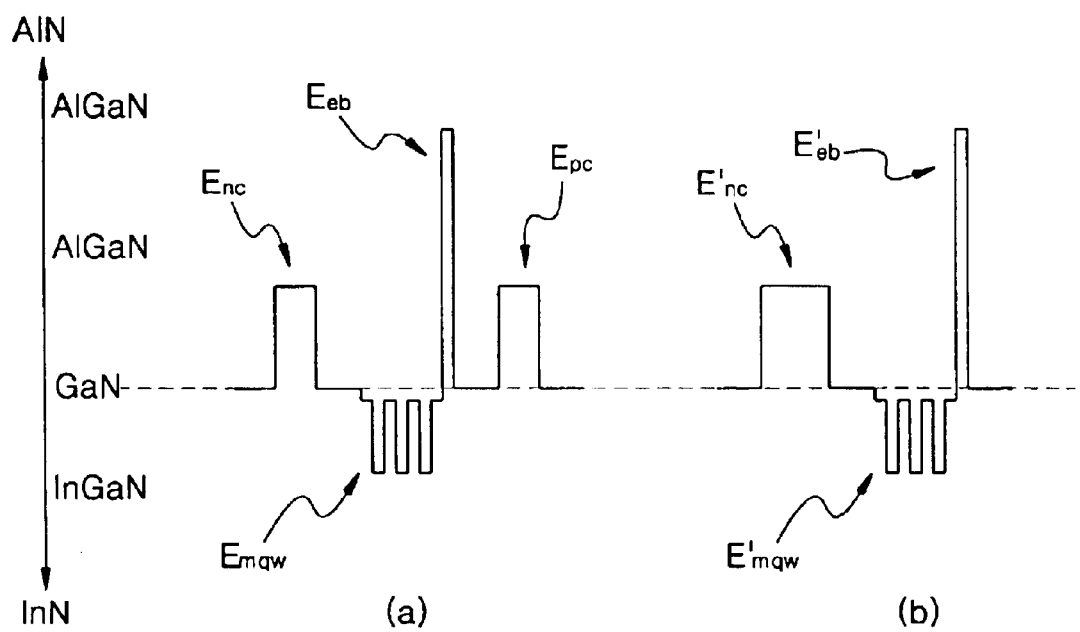
FIG. 12 is an energy band diagram of the semiconductor light emitting device illustrated in FIG. 11.

The reason the loss of light mode in the direction of installation of a substrate can be reduced is that the n-clad layer is much thicker than a conventional n-clad layer and accordingly an energy band becomes wide, which will be described with reference to FIG. 12.

FIGS. 12A and 12B are energy band diagrams of material layers constituting a conventional laser diode and a laser diode according to the fourth embodiment of the present invention, respectively. Referring to FIGS. 12A and 12B, an energy band $E_{nc}$ of a conventional n-type clad layer has a smaller width than an energy band $E_{nc}'$ of an n-type clad layer of the present invention. In addition, in FIGS. 12A and 12B, an energy band corresponding to an energy band $E_{pc}$ of a conventional p-type clad layer does not appear next to an energy band $E_{eb}'$ of an electron blocking layer of the present invention corresponding to an energy band $E_{eb}$ of a conventional electron blocking layer. Reference numerals $E_{mqw}$ and $E_{mqw}'$ indicate energy bands of active layers having a conventional multi-quantum well structure and a multi-quantum well structure of the present invention, respectively.

Experimental Example

To identify the characteristics of a laser diode according to the fourth embodiment of the present invention, an experiment was carried out as follows. In this experiment, three laser diode groups were used. To observe light gain and light mode through interpretation of a light waveguide of each of the laser diode groups, the light mode and light gain captured in a light waveguide were simultaneously calculated using a complex transfer matrix method (TMM).

The first of the three laser diode groups includes n-type and p-type clad layers having a thickness of 0.5 μm, and a p-type waveguide layer has a different thickness from the n-type and p-type clad layers. The second laser diode group includes only an n-type clad layer of 0.5 μm, and a p-type waveguide layer has a different thickness from the n-type clad layer. The third laser diode group has almost the same structure as the first laser diode group except that the thickness of an n-type clad layer is 1.0 μm.

Figure 13:
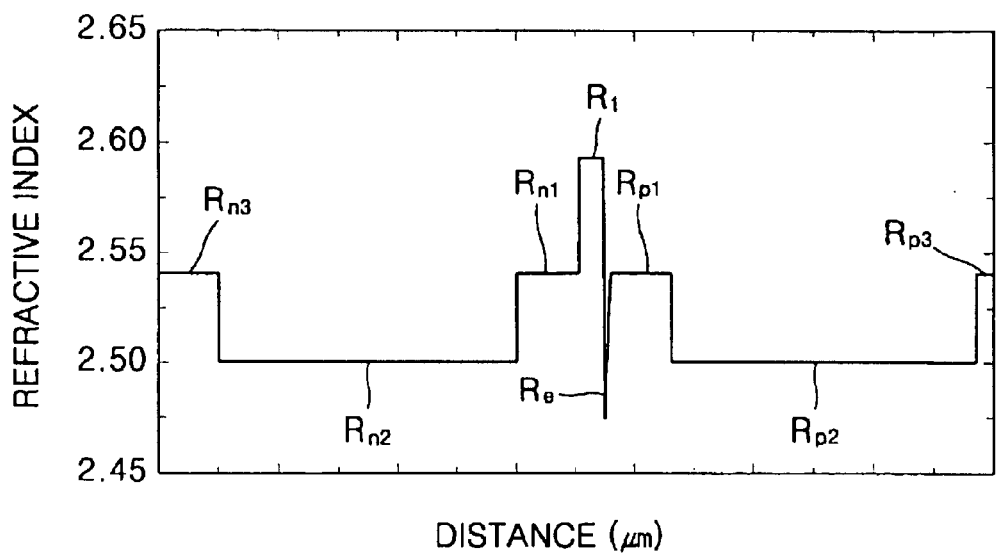
FIG. 13 is an enlarged diagram of the distribution of refractive indexes of laser diodes selected from a first laser diode group used in an experimental example of the present invention.

FIG. 13 is an enlarged diagram of the distribution of refractive indexes of material layers constituting the first laser diode group. In particular, FIG. 13 illustrates the distribution of refractive indexes of an active layer, n-type and p-type material layers.

In FIG. 13, reference numerals R1, Rn1, Rp1 and Re indicate the refractive indexes of an active layer, an n-type waveguide layer, a p-type waveguide layer, and an electron blocking layer, respectively. Also, reference numerals Rn2, Rp2, Rn3 and Rp3 indicate the refractive indexes of an n-type clad layer, a p-type clad layer, an n-type compound semiconductor layer and a p-type compound semiconductor layer, respectively.

Referring to FIG. 13, the refractive index gradually decreases from an active layer to n-type and p-type compound semiconductor layers. However, the refractive index Re of the electron blocking layer is smaller than those Rn2 and Rp2 of the n-type and p-type clad layers.

To design the structure of an optimal laser diode in the present experiment, the light gain and light mode of the first, second and third laser diode groups were calculated.

Figure 14:
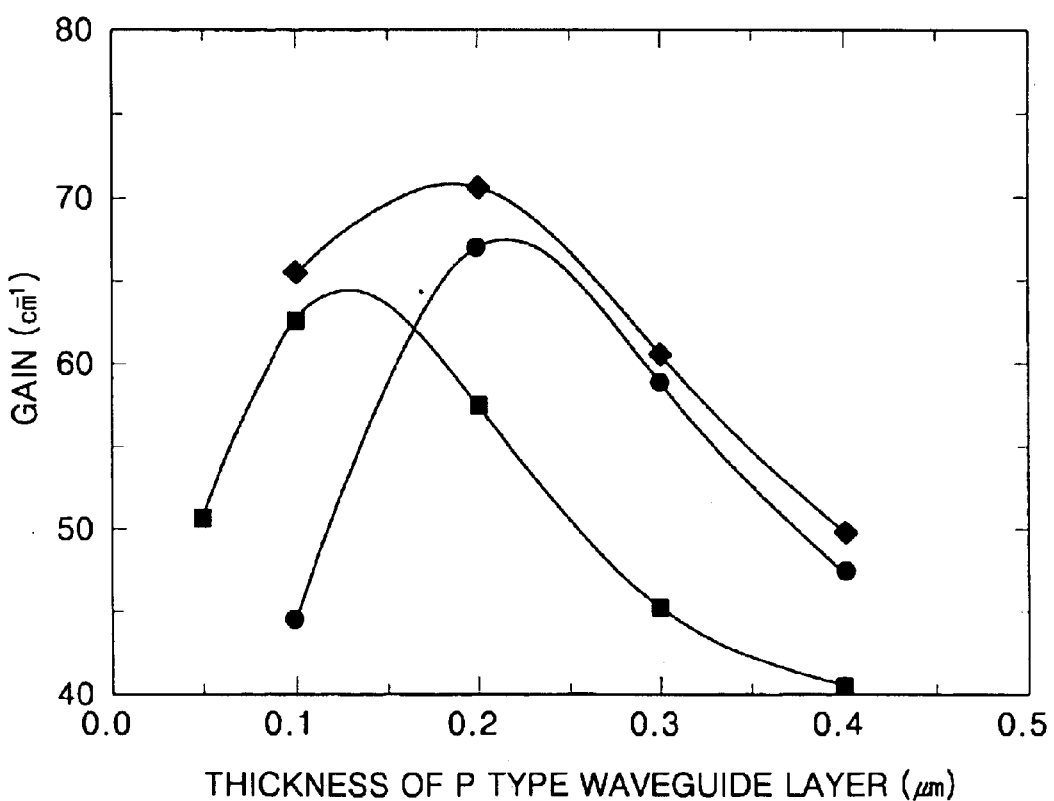
FIG. 14 is a graph illustrating changes in light gain of first through third groups used in an experimental example of the present invention.

FIG. 14 is a graph showing the results of the calculation by the three laser diode groups. Symbols ■, ●, and ♦ indicate the plotted data showing changes in the light gain of the first, second and third laser diode groups, respectively.

Referring to FIG. 14, the thickness of a p-type waveguide layer which is conducive to the highest light gain value changes depending on the structure of a light waveguide of each of the laser diode groups.

In FIG. 14, in the case of the first laser diode group including n-type and p-type clad layers, when the thickness of a p-type waveguide layer is about 0.12 μm, the light gain reaches to the highest value. In the case of the second and third laser diode groups, when the thickness of a p-type waveguide layer is 0.15 μm~0.22 μm, preferably about 0.2 μm, the highest light gain value is obtained.

Figure 15:
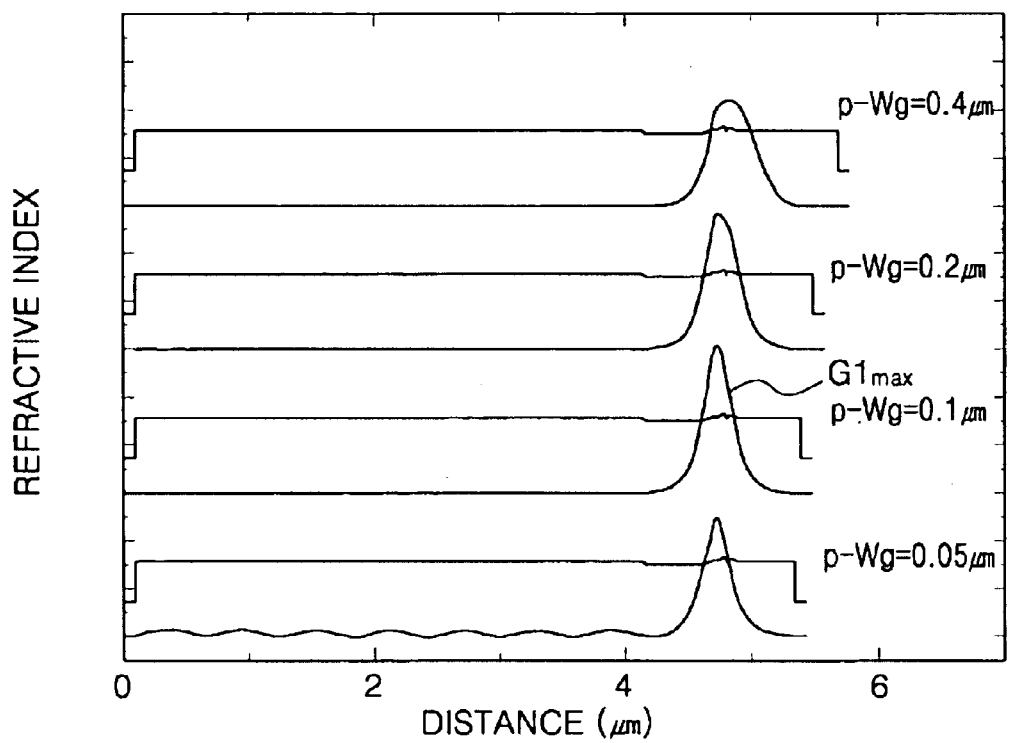
FIGS. 15 through 17 are graphs illustrating changes in light mode of first through third groups used in an experimental example of the present invention.
Figure 16:
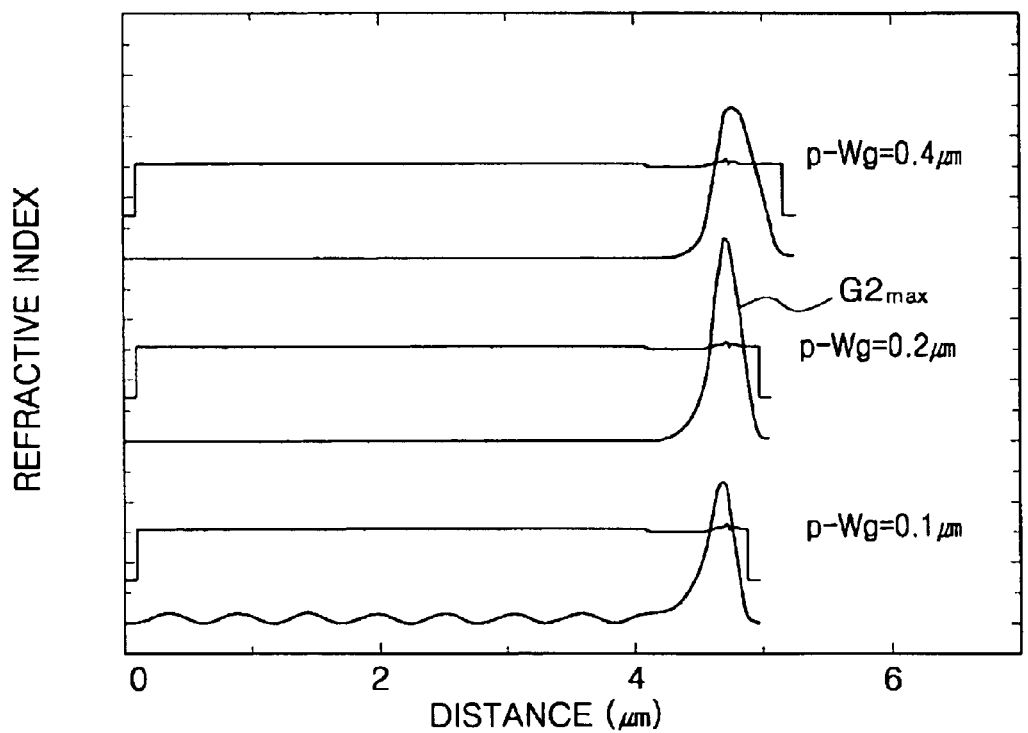
Figure 17:
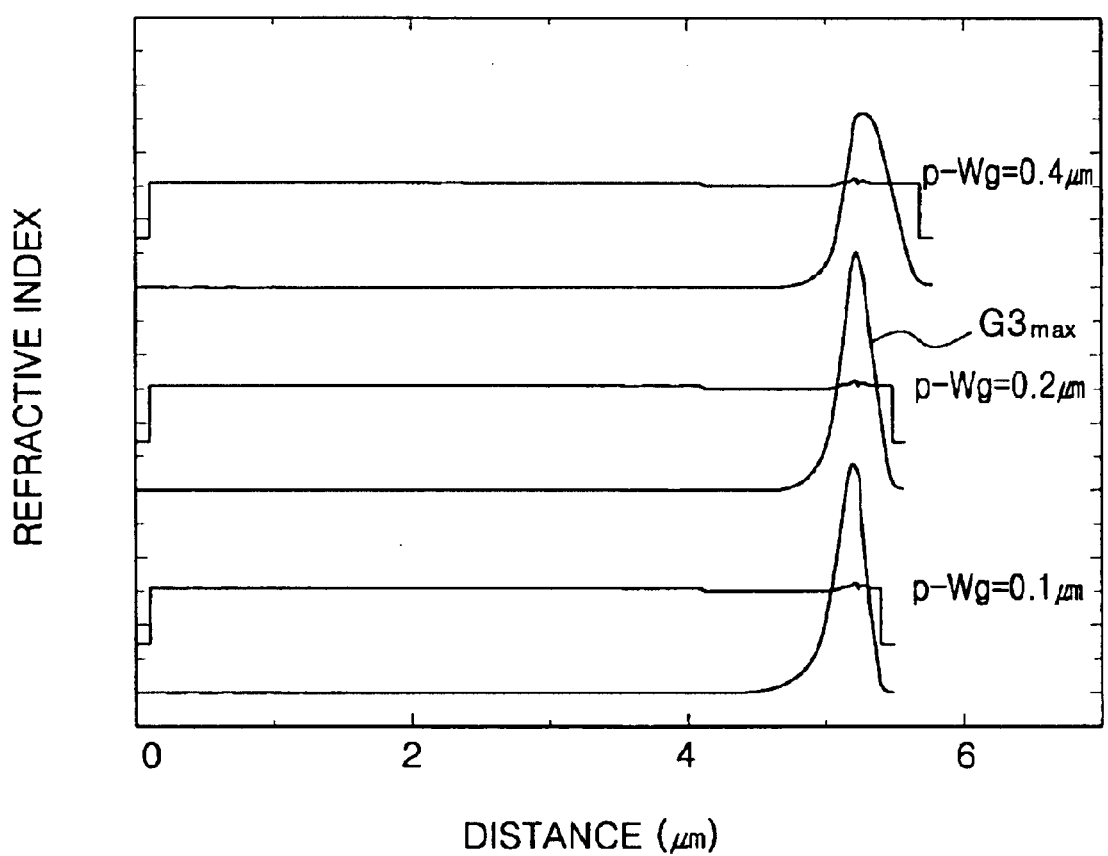

FIGS. 15 through 17 are graphs showing changes in the light mode of the first through third laser diode groups, respectively, according to changes in the thickness of a p-type waveguide layer. In FIGS. 15 through 17, the three laser diode groups show almost the same tendency. If the thickness of a p-type waveguide layer is smaller than a certain value conducive to the maximum light gain, the light mode inclines toward an n-type waveguide layer. On the contrary, if the thickness of a p-type waveguide layer is greater than a certain value conducive to the maximum light gain, the light mode inclines toward a p-type waveguide layer. In FIGS. 15 through 17, reference numerals G1max, G2max and G3max denote curves showing the maximum light gain.

Referring to FIG. 15, in the case of the first laser diode group, when the thickness of a p-type waveguide layer is 0.1 μm, the light mode reaches the highest value. If the thickness of a p-type waveguide layer is smaller than 0.1 μm, the light mode inclines toward an n-type waveguide layer (the left side of this figure). In contrast, if the thickness of a p-type waveguide layer is 0.2 μm or 0.4 μm, the light mode inclines toward a p-type waveguide layer (the right side of this figure).

Also, referring to FIGS. 16 and 17, in the case of the second and third laser diode groups, when the thickness of a p-type waveguide layer is about 0.2 μm, the maximum in light mode is obtained. If the thickness of a p-type waveguide layer is smaller or greater than 0.2 μm, the second and third laser diode groups show almost the same characteristics as the first laser diode group.

If the thickness of a p-type waveguide layer is smaller than a certain value conducive to the maximum light gain, the light mode inclines toward an n-type waveguide layer, which means the loss of the light mode and the decrease of the light gain. Therefore, to compensate for a decrease in light gain, a large number of carriers (electrons) should be supplied. As a result, a critical current value for generating a laser beam increases.

On the other hand, if the thickness of a p-type waveguide layer is greater than a certain value conducive to the maximum light gain, light gain in a p-type waveguide layer decreases and the reason may be that the light mode in a resonance region (an n-type waveguide layer+an active layer+a p-type waveguide layer) becomes wide so that the light gain in an active layer is reduced.

In conclusion, according to the present invention, it is possible to design a laser diode minimizing the loss of light mode and having a light waveguide structure which has a mono off-axial mode. The laser diode of the present invention can be realized by thickly forming an n-type clad layer instead of forming a p-type clad layer commonly included in conventional laser diodes. If the p-type clad layer is not formed, the strain of the entire laser diode can be reduced.

In the above description, the present invention has been described in detail with reference to preferred embodiments thereof. However, this detailed description does not restrict the range of the present invention as many changes may be made to the preferred embodiments within the scope of the appended claims. For example, one skilled in the art can apply the concept of the invention to a laser diode using compound semiconductor layers differing from the III-V group compound semiconductor layers described above, and laser diodes having a structure differing from the structure described above, such as a laser diode including a ridge waveguide. In the case of applying the present invention to a laser diode including a ridge waveguide, the constitution of an electron blocking layer and the structure of an n-type clad layer can be changed. It is possible to realize a laser diode which is different from the embodiment of the invention described herein in form and details without departing from the spirit and scope of the invention. Thus, the range of the present invention shall be defined by the appended claims.

As described above, the laser diode including a multi-quantum barrier in which an AlGaN/GaN double layer is repeatedly deposited or a strain-compensating multi-quantum barrier in which an AlGaN/InGaN double layer is repeatedly deposited at either the upper side or the lower side of an active layer, the laser diode in which a p-type clad layer is not formed and an n-type clad layer is thickly formed, or the laser diode having almost the same structure as the above two laser diodes except that it includes an electron blocking layer whose electron blocking efficiency is enhanced instead of the multi-quantum barrier layer. Therefore, some of the advantages using the laser diode of the present invention are as follows.

Firstly, due to a multi-quantum barrier layer or an electron blocking layer whose blocking efficiency is enhanced, it is possible to reduce the amount of carriers overflowing from an active layer.

Secondly, in the case of an AlGaN/InGaN strain compensating multi-quantum barrier layer, the strain within a laser diode can be reduced by strain compensating. If a p-type clad layer which is thermally and crystallographically mismatched with an active layer is not formed, the strain of an entire laser diode can be considerably reduced and consequently, it is possible to prevent material layers constituting a device from being cracked.

Thirdly, as a p-type clad layer is not formed in a laser diode, the concentration of p-type impurities is increased and the resistance is lowered. As a result, the loss of light mode and light gain increases and then a critical current value for laser emission of a laser diode decreases.

Fourthly, as a p-type clad layer is not formed in a laser diode, it is possible to prevent thermal deterioration of an active layer caused by a high-temperature process required for forming the p-type clad layer. Therefore, the temperature characteristics of a laser diode can be enhanced.

Finally, the lifetime of a semiconductor light emitting device can be lengthened and the process of manufacturing a laser diode can be simplified due to the omission of processes for forming a p-type clad layer.

What is claimed is:

1. A nitride semiconductor light emitting device comprising:
an active layer formed of a GaN family compound semiconductor; and
multi-quantum barrier layers formed by repeatedly depositing a double layer consisting of an $Al_xGa_{1-x}N$ layer and an $Al_xGa_{1-y}N$ layer at least two times, at either the upper or lower side of the active layer, by which an energy band has a multi-quantum barrier structure, wherein $0<x<1$, $0 \leq y\ 1$, and $x<y$, wherein the thicknesses of the $Al_xGa_{1-x}N$ layers of the double layers differ from each other, thereby making energy levels of the multi-quantum barrier layers differ from each other.

2. A nitride semiconductor light emitting device comprising:
   an active layer formed of a GaN family compound semiconductor; and
   multi-quantum barrier layers formed by repeatedly depositing a double layer consisting of an $Al_xGa_{1-x}N$ layer and an $Al_yGa_{1-y}N$ layer at least two times, at either the upper or lower side of the active layer, by which an energy band has a multi-quantum barrier structure, wherein $0<x<1$, $0\leq y<1$, and $x<y$,
   wherein the thicknesses of the $Al_yGa_{1-y}N$ layers of the double layers differ from each other, thereby making energy levels of the multi-quantum barrier layers differ from each other.

3. A nitride semiconductor light emitting device comprising:
   an active layer formed of a GaN family compound semiconductor; and
   multi-quantum barrier layers formed by repeatedly depositing a double layer consisting of an $Al_xGa_{1-x}N$ layer and an $Al_yGa_{1-y}N$ layer at least two times, at either the upper or lower side of the active layer, by which an energy band has a multi-quantum barrier structure, wherein $0<x<1$, $0\leq y<1$, and $x<y$,
   wherein the values of x for the $Al_xGa_{1-x}N$ layers of the double layers differ from each other, thereby making energy levels of the multi-quantum barrier layers differ from each other.

4. A nitride semiconductor light emitting device comprising:
   an active layer formed of a GaN family compound semiconductor; and
   multi-quantum barrier layers formed by repeatedly depositing a double layer consisting of an $Al_xGa_{1-x}N$ layer and an $In_yGa_{1-y}N$ layer at least two times, at either the upper or lower side of the active layer, by which an energy band has a multi-quantum barrier structure, wherein $0<x<1$ and $0<y\leq 1$,
   wherein the thicknesses of the $Al_xGa_{1-x}N$ layers of the double layers differ from each other, thereby making energy levels of the multi-quantum barrier layers differ from each other.

5. A nitride semiconductor light emitting device comprising:
   an active layer formed of a GaN family compound semiconductor; and
   multi-quantum barrier layers formed by repeatedly depositing a double layer consisting of an $Al_xGa_{1-x}N$ layer and an $In_yGa_{1-y}N$ layer at least two times, at either the upper or lower side of the active layer, by which an energy band has a multi-quantum barrier structure, wherein $0<x<1$ and $0<y\leq 1$,
   wherein the thicknesses of the $In_yGa_{1-y}N$ layers of the double layers differ from each other, thereby making energy levels of the multi-quantum barrier layers differ from each other.

6. A nitride semiconductor light emitting device comprising:
   an active layer formed of a GaN family compound semiconductor; and
   multi-quantum barrier layers formed by repeatedly depositing a double layer consisting of an $Al_xGa_{1-x}N$ layer and an $In_yGa_{1-y}N$ layer at least two times, at either the upper or lower side of the active layer, by which an energy band has a multi-quantum barrier structure, wherein $0<x<1$ and $0<y\leq 1$,
   wherein the values of x for the $Al_xGa_{1-x}N$ layers of the double layers differ from each other, thereby making the energy levels of the multi-quantum barrier layers differ from each other.

7. A nitride semiconductor light emitting device comprising:
   a substrate;
   an active layer formed on the substrate, in which light emission occurs;
   an n-type material layer for generating a laser beam, the n-type material layer being formed between the substrate and the active layer and which includes an n-type clad layer for preventing light loss in the direction of installation of the substrate;
   a carrier blocking layer, a p-type waveguide layer and a p-type compound semiconductor layer which are sequentially deposited on the active layer; and
   a first electrode and a second electrode generating a potential difference for diffusion of electrons to the active layer,
   wherein the carrier blocking layer is a multi-quantum barrier layer,
   wherein the multi-quantum barrier layer consists of double layers of an $Al_xGa_{1-x}N$ layer and an $In_yGa_{1-y}N$ layer ($0<x<1$, $0<y\leq 1$), and
   wherein the thicknesses of the $In_yGa_{1-y}N$ layers of the double layers differ from each other, thereby making energy levels of the multi-quantum barrier layer differ from each other.

8. The nitride semiconductor light emitting device of claim 7, wherein the n-type material layer comprises:
   an n-type waveguide layer formed between the n-type clad layer and the active layer; and
   an n-type compound semiconductor layer formed between the n-type clad layer and the substrate and connected to the first electrode.

9. The nitride semiconductor light emitting device of claim 7, wherein the active layer is a III-V group nitride compound semiconductor layer having a multi-quantum well structure.

10. The nitride semiconductor light emitting device of claim 7, wherein the n-type clad layer has a thickness between 0.5 μm and 1.7 μm.

11. The nitride semiconductor light emitting device of claim 7, wherein the p-type waveguide layer has a thickness between 0.15 μm and 0.22 μm, by which light mode and light gain are maximized.

12. A nitride semiconductor light emitting device comprising:
   a substrate;
   an active layer formed on the substrate, in which light emission occurs;
   an n-type material layer for generating a laser beam, the n-type material layer being formed between the substrate and the active layer and which includes an n-type clad layer for preventing light loss in the direction of installation of the substrate;
   a carrier blocking layer, a p-type waveguide layer and a p-type compound semiconductor layer which are sequentially deposited on the active layer; and a first electrode and a second electrode generating a potential difference for diffusion of electrons to the active layer, wherein the carrier blocking layer is a multi-quantum barrier layer, and wherein the multi-quantum barrier layer consists of a plurality of double layers of an $Al_xGa_{1-x}N$ layer and an $In_yGa_{1-y}N$ layer ($0<x<1$, $0<y\leq1$) and wherein the values of x for the $Al_xGa_{1-x}N$ layers of the double layers differ from each other, thereby making energy levels of the multi-quantum barrier layer differ from each other.

13. The nitride semiconductor light emitting device of claim 7, wherein the p-type waveguide layer and the p-type compound semiconductor layer are the same material layer, wherein the doping concentration of the p-type compound semiconductor layer is higher than that of the p-type waveguide layer.

14. The nitride semiconductor light emitting device of claim 7, wherein the material of the substrate is one selected from the group consisting of sapphire, silicon carbon (SiC), silicon (Si), gallium arsenic (GaAs), gallium nitride (GaN) and zinc oxide (ZnO).

15. The nitride semiconductor light emitting device of claim 8, wherein the active layer is a III-V group nitride compound semiconductor layer having a multi-quantum well structure.

16. The nitride semiconductor light emitting device of claim 8, wherein the n-type clad layer has a thickness between 0.5 $\mu$m and 1.7 $\mu$m.

* * * * *